US012616013B2

(12) United States Patent
Brun

(10) Patent No.: US 12,616,013 B2
(45) Date of Patent: Apr. 28, 2026

(54) DIELECTRIC BONDABLE CHIPLET FOR PACKAGE ARCHITECTURE INCLUDING RESET VIA SIMPLIFICATION

(71) Applicant: Intel Corporation, Santa Clara, CA (US)

(72) Inventor: Xavier F. Brun, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 1013 days.

(21) Appl. No.: 17/485,283

(22) Filed: Sep. 24, 2021

(65) Prior Publication Data

US 2023/0098446 A1     Mar. 30, 2023

(51) Int. Cl.
*H01L 23/48* (2006.01)
*H01L 23/498* (2006.01)

(52) U.S. Cl.
CPC ...... *H01L 23/481* (2013.01); *H01L 23/49816* (2013.01); *H01L 23/49822* (2013.01)

(58) Field of Classification Search
None
See application file for complete search history.

(56) References Cited

U.S. PATENT DOCUMENTS

| | | | | |
|---|---|---|---|---|
| 2014/0312483 A1* | 10/2014 | Vo | ....................... | H01L 25/0655 |
| | | | | 257/691 |
| 2017/0170155 A1* | 6/2017 | Yu | ........................... | H01L 25/50 |
| 2019/0252322 A1* | 8/2019 | Braunisch | ......... | H01L 23/49822 |
| 2021/0391302 A1* | 12/2021 | Kao | ................. | H01L 21/76898 |

* cited by examiner

*Primary Examiner* — Nicholas J Tobergte
(74) *Attorney, Agent, or Firm* — Schwabe, Williamson & Wyatt, P.C.

(57) ABSTRACT

Embodiments described herein include electronic packages. In an embodiment, an electronic package comprises a die and a through substrate via that passes through the die. In an embodiment, the through substrate via is coupled to a backside pad on the die. In an embodiment, a first layer is over the backside pad, where the first layer comprises a first dielectric material. In an embodiment, a second layer is over the first layer, where the second layer comprises a second dielectric material. In an embodiment, a via is through the first layer and the second layer.

14 Claims, 14 Drawing Sheets

DIELECTRIC BONDABLE CHIPLET FOR PACKAGE ARCHITECTURE INCLUDING RESET VIA SIMPLIFICATION

TECHNICAL FIELD

Embodiments of the present disclosure relate to electronic packages, and more particularly to bondable dielectric interfaces that are used as a reset via layer.

BACKGROUND

Multi-chip modules are becoming more prevalent as the semiconductor industry continues driving towards increased performance and efficiency. In a particular architecture, a chiplet may be provided below an overlying die. Connections between the chiplet and the underlying package substrate can be made through solder connections. However, solder connections have a substantially large Z-height (e.g., approximately 35 μm or greater). Additional approaches may utilize connections through a die attach film (DAF). However, the use of a DAF requires a thick package side bump (PSB) on the die chiplet in order to accommodate DAF removal (i.e., PSB reveal).

In addition to Z-height considerations, alignment between components of a die module are increasingly more stringent as the number of interconnects continue to increase. Particularly, the alignment accuracy of traditional bonding processes, such as thermocompression bonding (TCB), is quickly approaching practical limits. As such, new bonding processes are needed in order to continue scaling electronic packaging architectures.

EMBODIMENTS OF THE PRESENT DISCLOSURE

Described herein are bondable dielectric interfaces that are used as a reset via layer, in accordance with various embodiments. In the following description, various aspects of the illustrative implementations will be described using terms commonly employed by those skilled in the art to convey the substance of their work to others skilled in the art. However, it will be apparent to those skilled in the art that the present invention may be practiced with only some of the described aspects. For purposes of explanation, specific numbers, materials and configurations are set forth in order to provide a thorough understanding of the illustrative implementations. However, it will be apparent to one skilled in the art that the present invention may be practiced without the specific details. In other instances, well-known features are omitted or simplified in order not to obscure the illustrative implementations.

Various operations will be described as multiple discrete operations, in turn, in a manner that is most helpful in understanding the present invention, however, the order of description should not be construed to imply that these operations are necessarily order dependent. In particular, these operations need not be performed in the order of presentation.

As noted above, multi-die modules ideally have a minimal z-height. Additionally, the accuracy of placing the dies in the package is approaching limits of existing processes, such as TCB. Accordingly embodiments disclosed herein include reset vias that pass through a pair of dielectric layers. The dielectric layers are bonded together using a low-temperature bonding process. The placement accuracy of dielectric-to-dielectric bonding is also significantly improved compared to TCB bonding. Additionally, the thicknesses of the dielectric layers may be approximately 1 μm or smaller, and there is minimal impact to the z-height of the module.

Figure 1A:
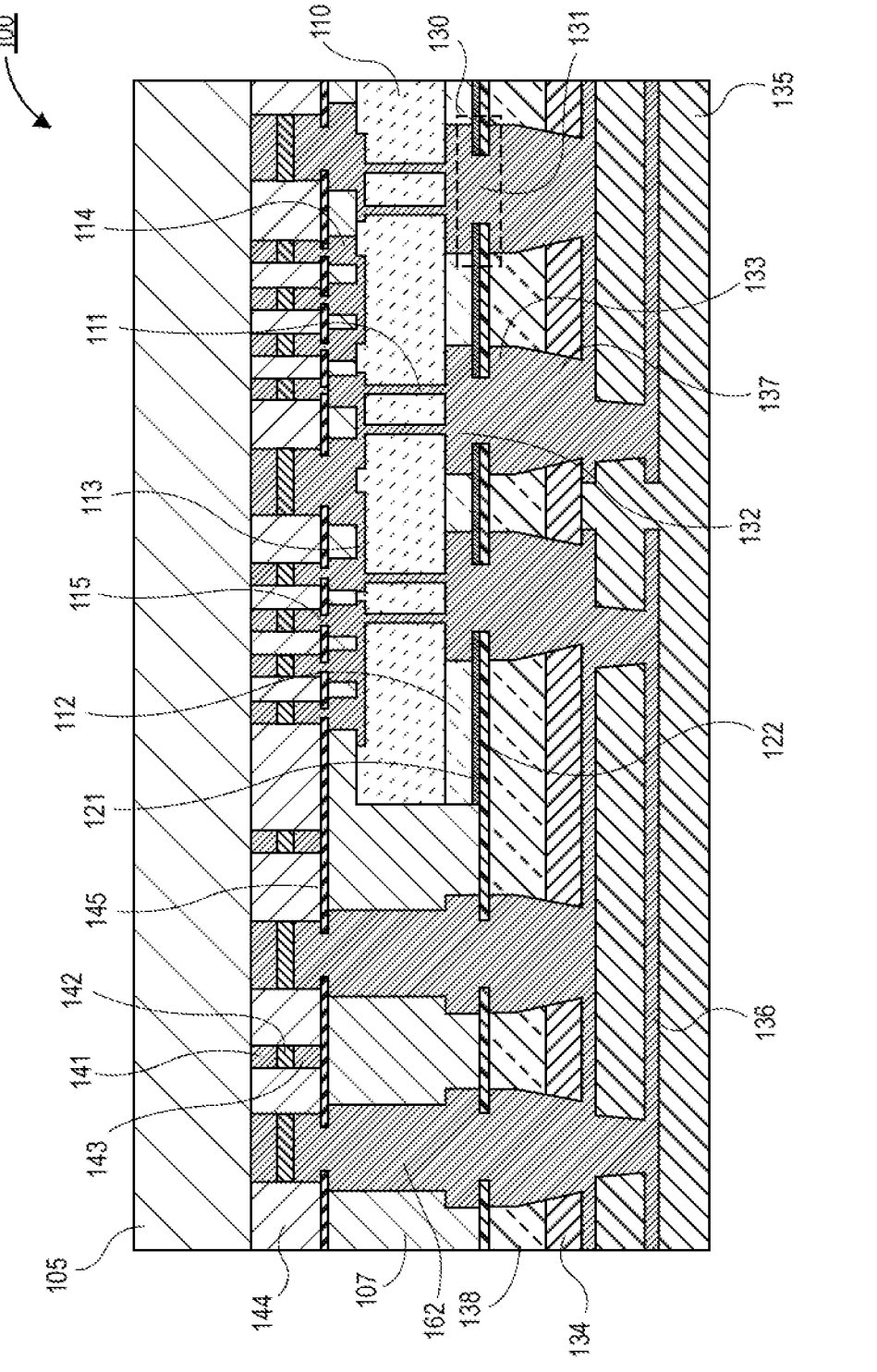
FIG. 1A is a cross-sectional illustration of an electronic package with a die module that comprises a reset via layer that passes through a pair of dielectric layers, in accordance with an embodiment.

Referring now to FIG. 1A, a cross-sectional illustration of an electronic package 100 is shown, in accordance with an embodiment. In an embodiment, the electronic package 100 comprises a plurality of dies. For example, a first die 105 is provided at the top of the electronic package 100 and a second die 110 is provided below the first die 105. First die pads 141 are coupled to pads 143 by interconnects 142. The interconnects 142 may be a solder or the like. In an embodiment, an underfill 144 or the like may surround the first die pads 141, the pads 143, and the interconnects 142. The pads 143 may be coupled to second die pads 114 through reset vias 115 through a reset layer 145.

In an embodiment, pads 114 may be coupled to routing 113 on the backside surface of the second die 110. In an embodiment, the second die 110 may also include through substrate vias (TSVs) 111 that connect to bottom side pads 132. The bottom side pads 132 may be embedded in a mold layer 112. Additionally, the second die 110 may be embedded in a mold layer 107. In an embodiment, vias 162 may pass through the mold layer 107. The vias 162 may be adjacent to the second die 110. As such, signals, power, and/or ground, can pass from the first die 105 to the package substrate 135 outside of the second die 110.

In an embodiment, a first dielectric layer 121 may be provided below the second die 110. The first dielectric layer 121 may be bonded to a second dielectric layer 122. The second dielectric layer 122 may extend past the edge of the second die 110. As such, the second dielectric layer 122 may contact the first dielectric layer 121 and the mold layer 107. In an embodiment, the first dielectric layer 121 may have a thickness that is approximately 1 µm or smaller. Similarly, the second dielectric layer 122 may have a thickness that is approximately 1 µm or smaller. In an embodiment, the first dielectric layer 121 may be the same material as the second dielectric layer 122. However, in other embodiments, the first dielectric layer 121 may be a different material than the second dielectric layer 122. The first dielectric layer 121 and the second dielectric layer 122 may be any suitable dielectric material for dielectric-to-dielectric bonding. In some embodiments, the first dielectric layer 121 and the second dielectric layer 122 may comprise silicon and nitrogen (e.g., $SiN_x$), silicon and oxygen (e.g., $SiO_x$), or silicon, carbon and nitrogen (e.g., $SiC_xN_y$).

In an embodiment, vias 131 may be formed through the first dielectric layer 121 and the second dielectric layer 122. The vias 131 may be referred to as "reset vias" since they can reset the positioning of the underlying pad 133 in order to account for any misalignment of the overlying second die 110. A more detailed zoomed in illustration of the box 130 is shown in FIG. 1C in order to more particularly illustrate the structure of the vias 131. For example, while shown as having vertical sidewalls, it is to be appreciated that the vias 131 may be tapered in some embodiments.

In an embodiment, the underlying pads 133 may be coupled to a package substrate 135 by interconnects 137. The interconnects 137 are shown as having the same material as the pads 133, but it is to be appreciated that the interconnects 137 may be solder or the like. The interconnects 137 may pass through an underfill 138 and a solder resist layer 134 to contact traces/pads 136 in the package substrate 135.

Figure 1B:
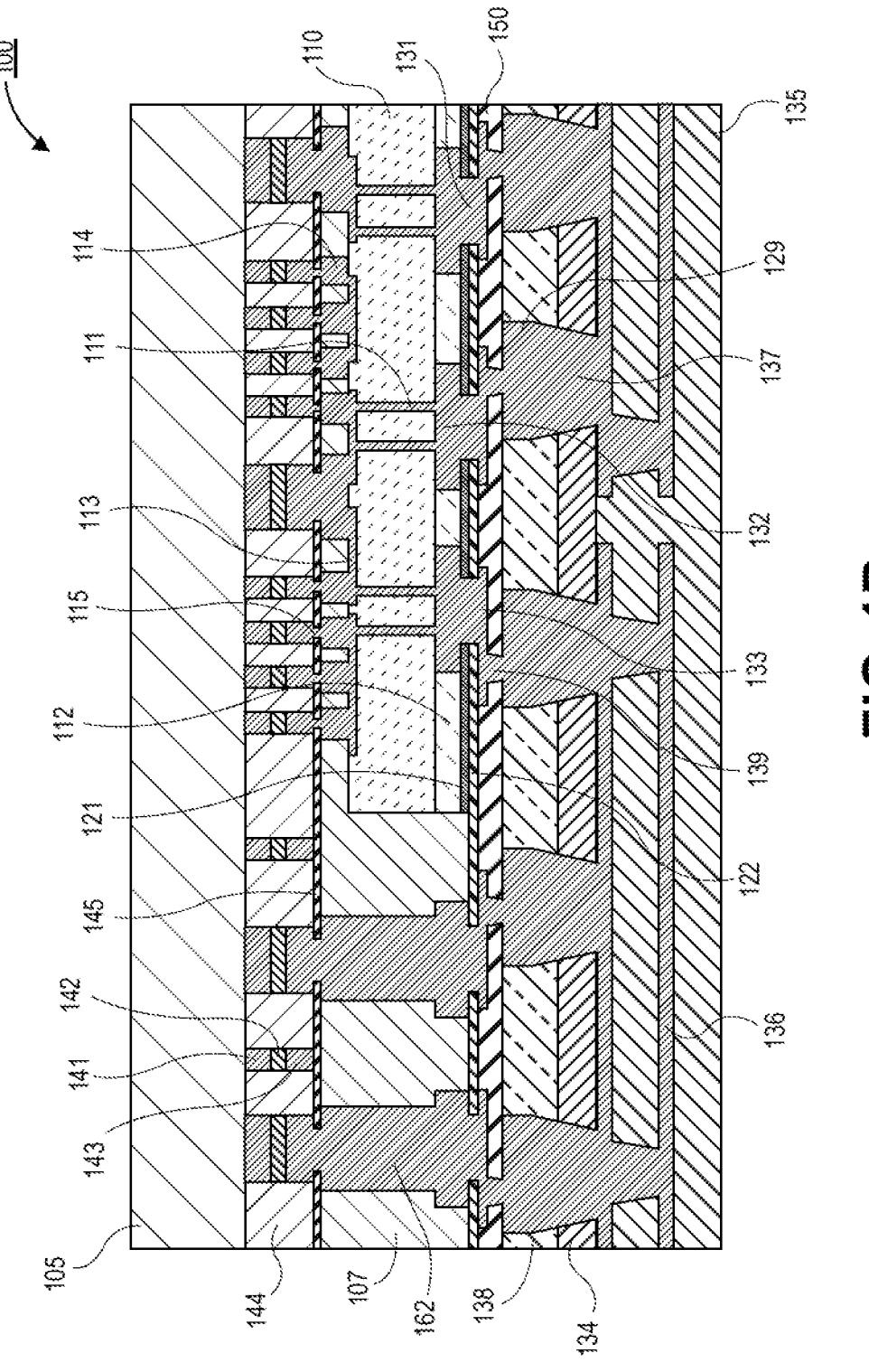
FIG. 1B is a cross-sectional illustration of an electronic package with a die module that comprises a reset via layer and a redistribution layer on the die module, in accordance with an embodiment.
Figure 1C:
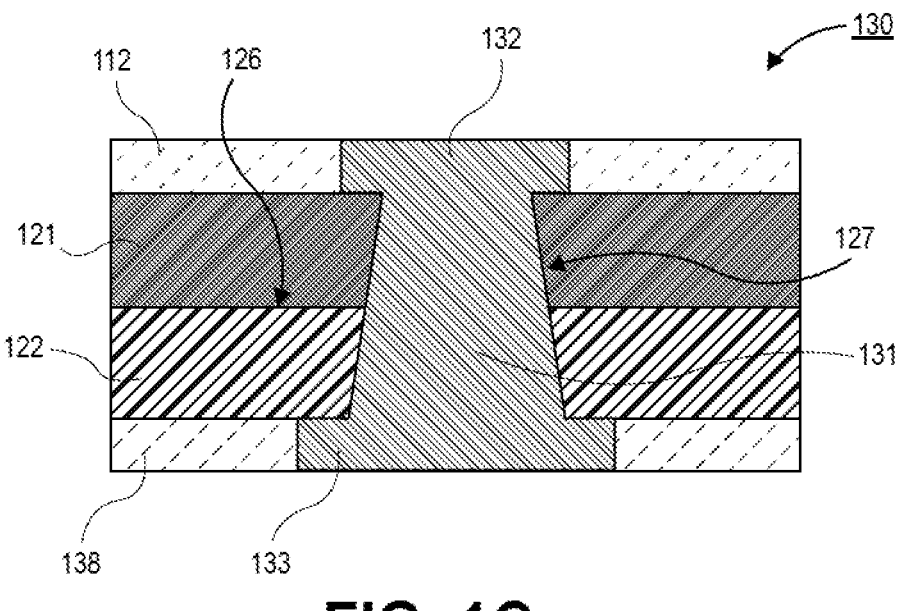
FIG. 1C is a cross-sectional illustration of the reset via through the pair of dielectric layers, in accordance with an embodiment.

Referring now to FIG. 1B, a cross-sectional illustration of an electronic package 100 is shown, in accordance with an additional embodiment. In an embodiment, the electronic package 100 may be similar to the electronic package 100 in FIG. 1A, with the addition of a redistribution layer 150. In an embodiment, the redistribution layer 150 may include pads 133 and vias 139. The redistribution layer 150 may be used to adjust the placement of the pads 129 that are connected to the interconnects 137. In the illustrated embodiment, a single routing layer is shown in the redistribution layer 150. However, it is to be appreciated that any number of routing layers may be included in the redistribution layer 150.

In an embodiment, the redistribution layer 150 may be a dielectric material that is laminated over the second dielectric layer 122. That is, the redistribution layer 150 may be directly contacting the second dielectric layer 122. In an embodiment, the redistribution layer 150 is a different material than the second dielectric layer 122. Though in some embodiments, the redistribution layer 150 and the second dielectric layer 122 may comprise the same material.

Referring now to FIG. 1C, a cross-sectional illustration of a region 130 in FIG. 1A is shown, in accordance with an embodiment. In an embodiment, the region 130 comprises a via 131 that passes through the first dielectric layer 121 and the second dielectric layer 122. The via 131 couples together a pad 132 in mold layer 112 and a pad 133 in underfill 138. As shown, the via 131 has a tapered sidewall 127. For example, a distance between a narrow end of the via 131 and the pad 132 is smaller than a distance between a wide end of the via 131 and the pad 133. That is, the narrow end of the via 131 is closer to the second die (not shown in FIG. 1C) than the wide end of the via 131.

It is to be appreciated that the sidewalls 127 of the via 131 have a uniform slope through both the first dielectric layer 121 and the second dielectric layer 122. Additionally, the sidewalls 127 through both layers are substantially coplanar with each other. That is, there is no discontinuity of the sidewall 127 at the junction between the first dielectric layer 121 and the second dielectric layer 122. This is different than if separate vias were stacked on top of each other to form a connection through the two different layers.

In FIG. 1C, the first dielectric layer 121 and the second dielectric layer 122 are shown with different shadings. However, as described in greater detail above, the first dielectric layer 121 and the second dielectric layer 122 may comprise the same material in some embodiments. Despite sometimes being the same material, it is to be appreciated that a seam 126 may still be present at the interface between the first dielectric layer 121 and the second dielectric layer 122 in some embodiments.

Referring now to FIGS. 2A-2H, a series of cross-sectional illustrations depicting a process for assembling an electronic package is shown, in accordance with an embodiment. In an embodiment, the electronic package comprises a reset layer that is formed by a first dielectric layer and a second dielectric layer. A reset via is provided through the first dielectric layer and the second dielectric layer.

Figure 2A:
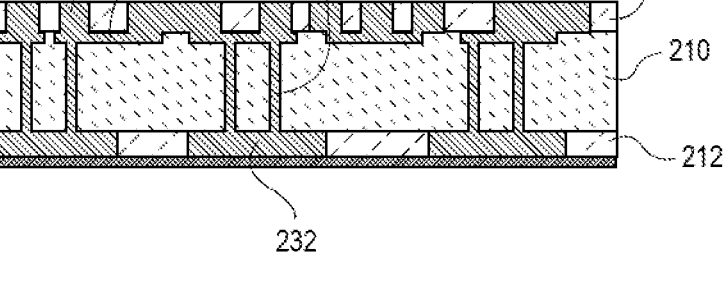
FIG. 2A is a cross-sectional illustration of a chiplet with a first dielectric layer on a bottom surface, in accordance with an embodiment.

Referring now to FIG. 2A, a cross-sectional illustration of a first die 210 is shown, in accordance with an embodiment. In an embodiment, the first die 210 may be a chiplet used in a multi-die package. The first die 210 may comprise a CPU, a GPU, a memory die, or any other die type. In an embodiment, the first die 210 may comprise TSVs 211 that pass through a thickness of the first die 210. As such, signals may pass through the thickness of the first die 210. In an embodiment, the bottom of the TSVs 211 may be coupled to pads 232, and the top of the TSVs 211 may be coupled to traces 213 and pads 214. Pads 232 may be in a mold layer 212 and pads 214 may be in a mold layer 209. While referred to as being mold layers, layers 212 and 209 may be any material, such as a dielectric or the like, and do not necessarily need to be applied with a molding process. Additionally, mold layer 209 may be omitted, and the pads 214 may be protruding.

In an embodiment, the first die 210 may further comprise a first layer 221 disposed over the pads 232 and the mold layer 212. The first layer 221 may be a dielectric material. For example, the first layer 221 may comprise silicon and nitrogen (e.g., $SiN_x$), the first layer 221 may comprise silicon and oxygen (e.g., $SiO_x$), or the first layer 221 may comprise silicon, carbon, and nitrogen (e.g., $SiC_xN_y$). In an embodiment, a thickness of the first layer 221 may be approximately 1 µm or less. In an embodiment, the first layer 221 may be deposited with any suitable process, such as a physical vapor deposition (PVD) process, a plasma enhanced chemical vapor deposition (PECVD) process, or atomic layer deposition (ALD) process. In the case of a $SiO_X$ first layer, the $SiO_X$ may be grown directly on the first die 210 with a thermal process. In an embodiment, the first layer 221 may also comprise two or more different dielectric layers. For example, layer 221 may comprise a thermal oxide (e.g., $SiO_X$) bonded to a deposited SiN layer.

Figure 2B:
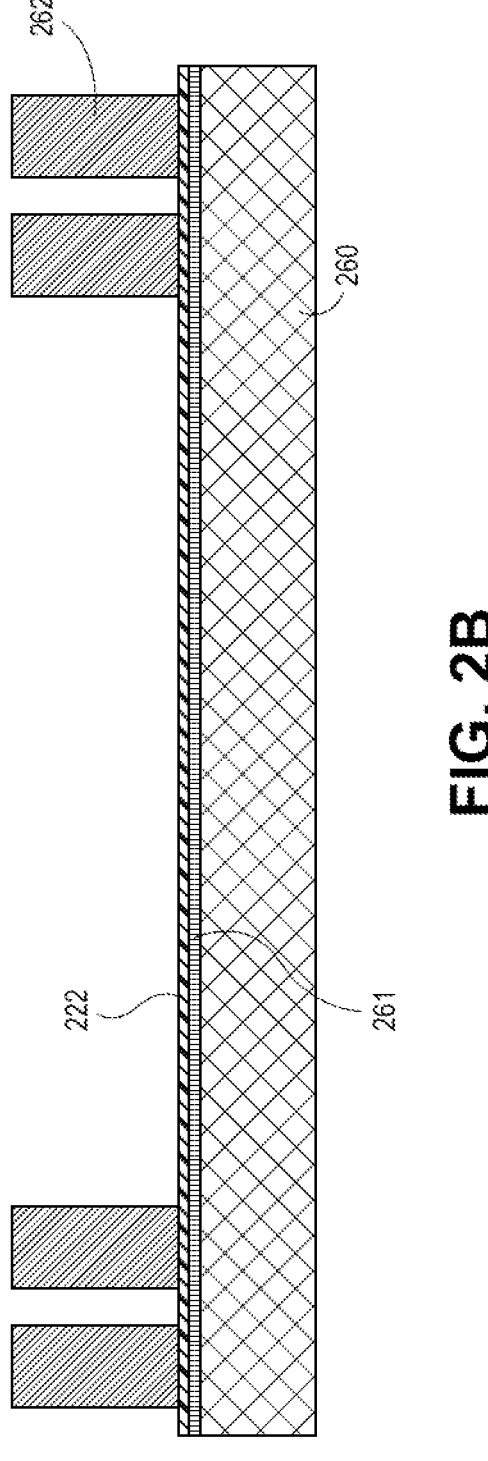
FIG. 2B is a cross-sectional illustration of a carrier with a release layer and a second dielectric layer over the release layer, in accordance with an embodiment.

Referring now to FIG. 2B, a cross-sectional illustration of a glass carrier 260 is shown, in accordance with an embodiment. In an embodiment, the glass carrier 260 may comprise a release layer 261 over a top surface. The release layer 261 may be a laser release layer 261. That is, exposure by a laser that passes through the glass carrier 260 can be used to release the release layer 261 in a subsequent processing operation. In an embodiment, a second layer 222 is disposed over the release layer 261. The second layer 222 may be a dielectric material. For example, the second layer 222 may comprise silicon and nitrogen (e.g., $SiN_X$), or the second layer 222 may comprise silicon and oxygen (e.g., $SiO_X$). In an embodiment, the second layer 222 may be the same material as the first layer 221 described in greater detail above. In other embodiments, the second layer 222 is a different material than the first layer 221. The second layer 222 may have a thickness that is approximately 1 μm or less. In an embodiment, the second layer 222 may be deposited with a PVD process or the like.

In an embodiment, pillars 262 may be provided over a surface of the second layer 222. The pillars 262 may be formed with any suitable process. For example, seed layers and patterned photoresist layers may be disposed over the second layer 222. A plating process may then be used to plate the pillars 262. After the pillars 262 are formed, the photoresist and seed layers may be stripped (or etched) in order to expose the underlying second layer 222.

Figure 2C:
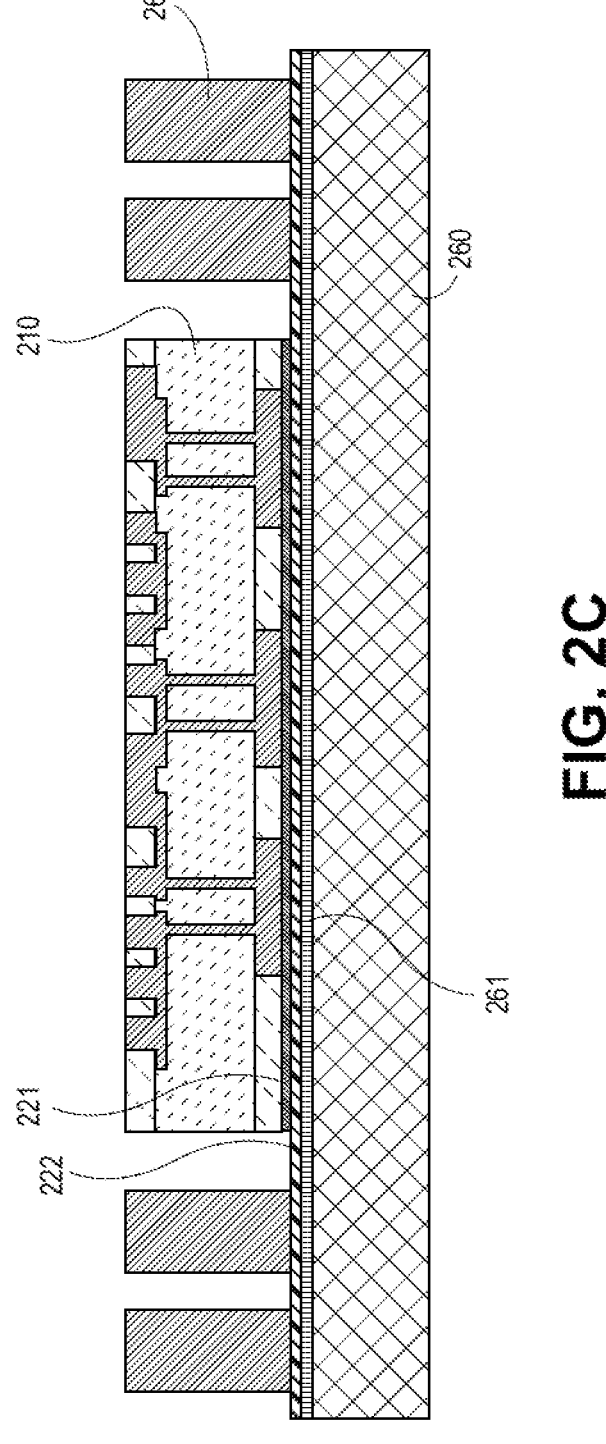
FIG. 2C is a cross-sectional illustration of the chiplet bonded to the carrier, in accordance with an embodiment.

Referring now to FIG. 2C, a cross-sectional illustration of the glass carrier 260 after the first die 210 is mounted to the glass carrier 260 is shown, in accordance with an embodiment. In an embodiment, the first die 210 may be mounted to the glass carrier 260 using hybrid bonding interconnect (HBI) bonding tools. HBI bonding tools have an accuracy that is greater than the accuracy available with other bonding techniques, such as TCB and the like. Additionally, the bonding is less complex than typical HBI processes because there is no metal-to-metal bonding. The only bond is the first layer 221 to the second layer 222, which are both dielectric materials. As such, after placement of the first die 210, only a low temperature annealing process is needed in order to bond the first layer 221 to the second layer 222. For example, the annealing process may be at a temperature of approximately 250° C. or less. In an embodiment, the annealing process forms a bond between the first layer 221 and the second layer 222, but there may still be a visible seam between the two layers (as described above), even when the first layer 221 and the second layer 222 are the same material. In some embodiments, a plasma treatment of the surfaces of the first layer 221 and/or the second layer 222 may be implemented before the bonding process. Additionally, a rinse with deionized water or other cleaning solutions may be executed before the bonding of the first die 210 to the glass carrier 260.

Figure 2D:
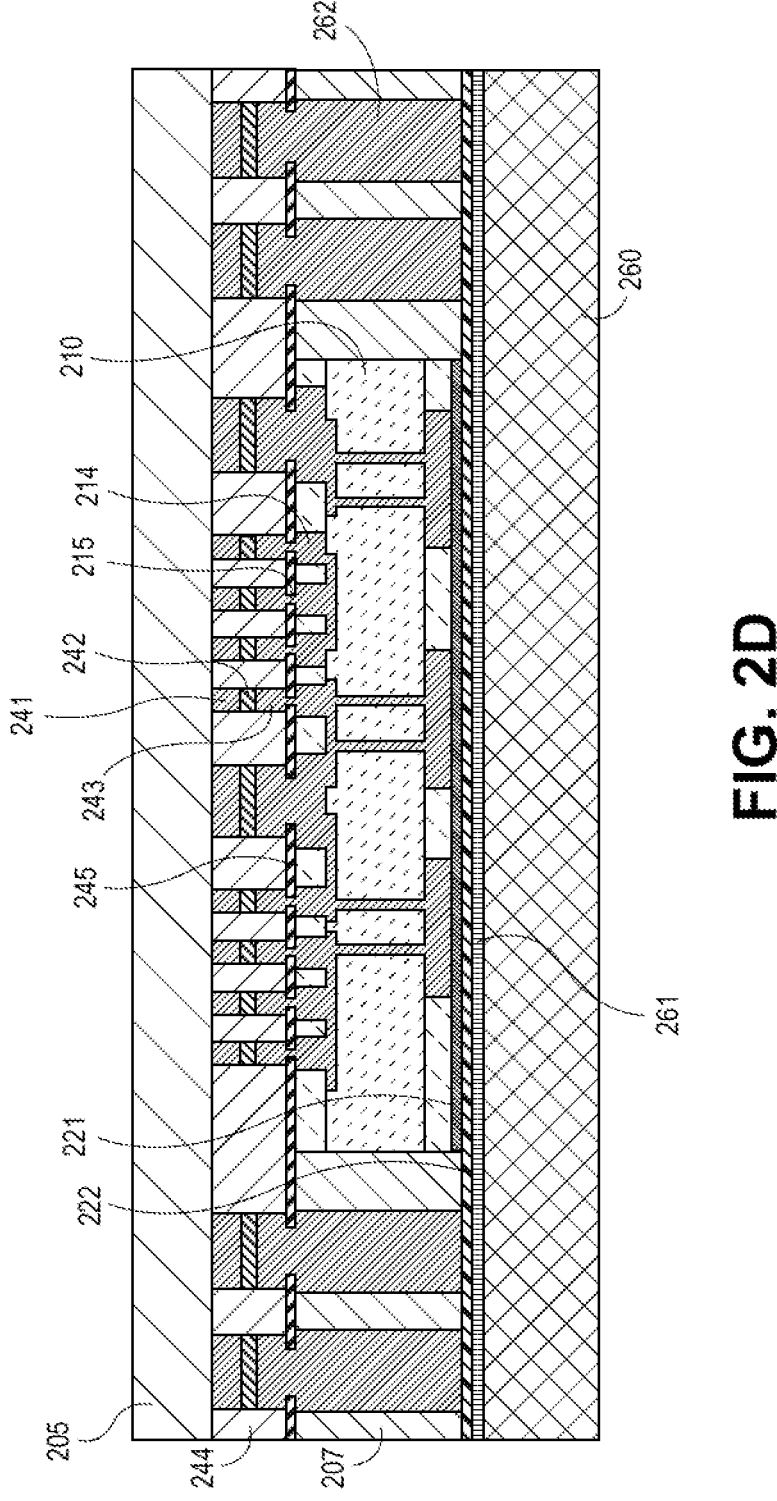
FIG. 2D is a cross-sectional illustration of the module after a die is attached over the chiplet, in accordance with an embodiment.

Referring now to FIG. 2D, a cross-sectional illustration of the device after a second die 205 is attached over the first die 210 is shown, in accordance with an embodiment. The second die 205 may be a CPU, a GPU, a memory die, or any other type of die. In other embodiments, there may be a plurality of second dies 205 over the first die 210. In an embodiment, the first die 210 and the pillars 262 may be surrounded by a mold layer 207. In instances with the mold layer 209 omitted, the mold layer may also surround the pads 214. A third layer 245 may be provided over the mold layer 207, the first die 210, and the pillars 262. The third layer 245 may be a dielectric material or an organic passivation layer (e.g., PI or PBO). In an embodiment, vias 215 are made through the third layer 245 to contact the underlying pads 214 and the pillars 262. The vias 215 may be referred to as reset vias 215 in some embodiments. Pads 243 may be provided over the top surfaces of the vias 215. In some embodiments, one or more redistribution layers may be provided over the third layer 245 before reaching the pads 243. The pads 243 may be electrically coupled to die pads 241 by interconnects 242. The pads 243, the interconnects 242, and the die pads 241 may be surrounded by an underfill material 244 or molding compound.

As shown, the second die 205 is coupled to the first die 210. The second die 205 may also be coupled to the pillars 262. As such, signals from the second die 205 to the package substrate (added in a subsequent processing operation) may pass through the thickness of the mold layer 207 outside of the first die 210. In other instances, signals may pass from the second die 205 to the package substrate through the first die 210.

Figure 2E:
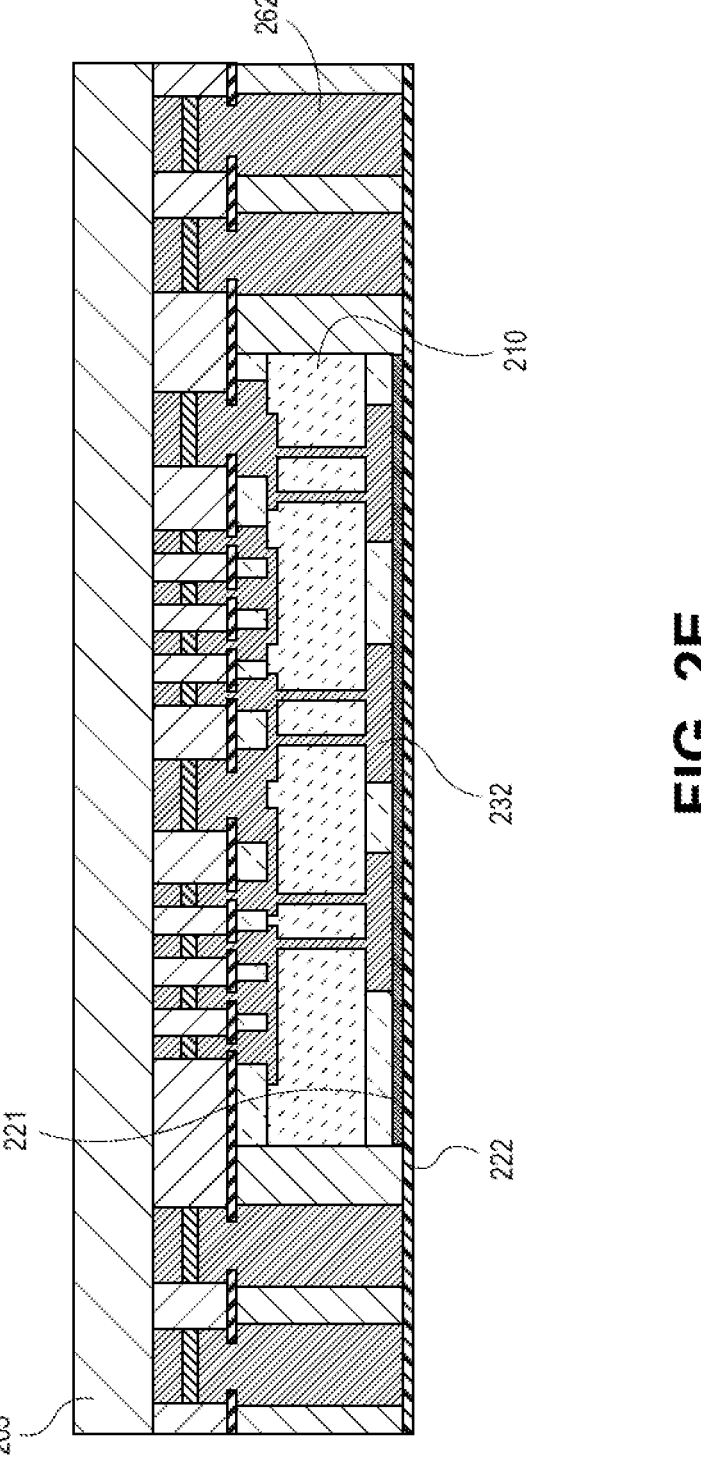
FIG. 2E is a cross-sectional illustration of the module after the carrier is released, in accordance with an embodiment.

Referring now to FIG. 2E, a cross-sectional illustration of the die module after the carrier 260 is released is shown, in accordance with an embodiment. In an embodiment, the carrier 260 is released by exposing the release layer 261 to a laser. In other embodiments, the release layer 261 may be released using other mechanism, such as heating or the like. After removal of release layer 261, the exposed second layer 222 may be cleaned. At this point in the process flow, there are no exposed conductive features on the bottom of the die module. The only surface that is exposed on the bottom of the die module is the second layer 222.

Figure 2F:
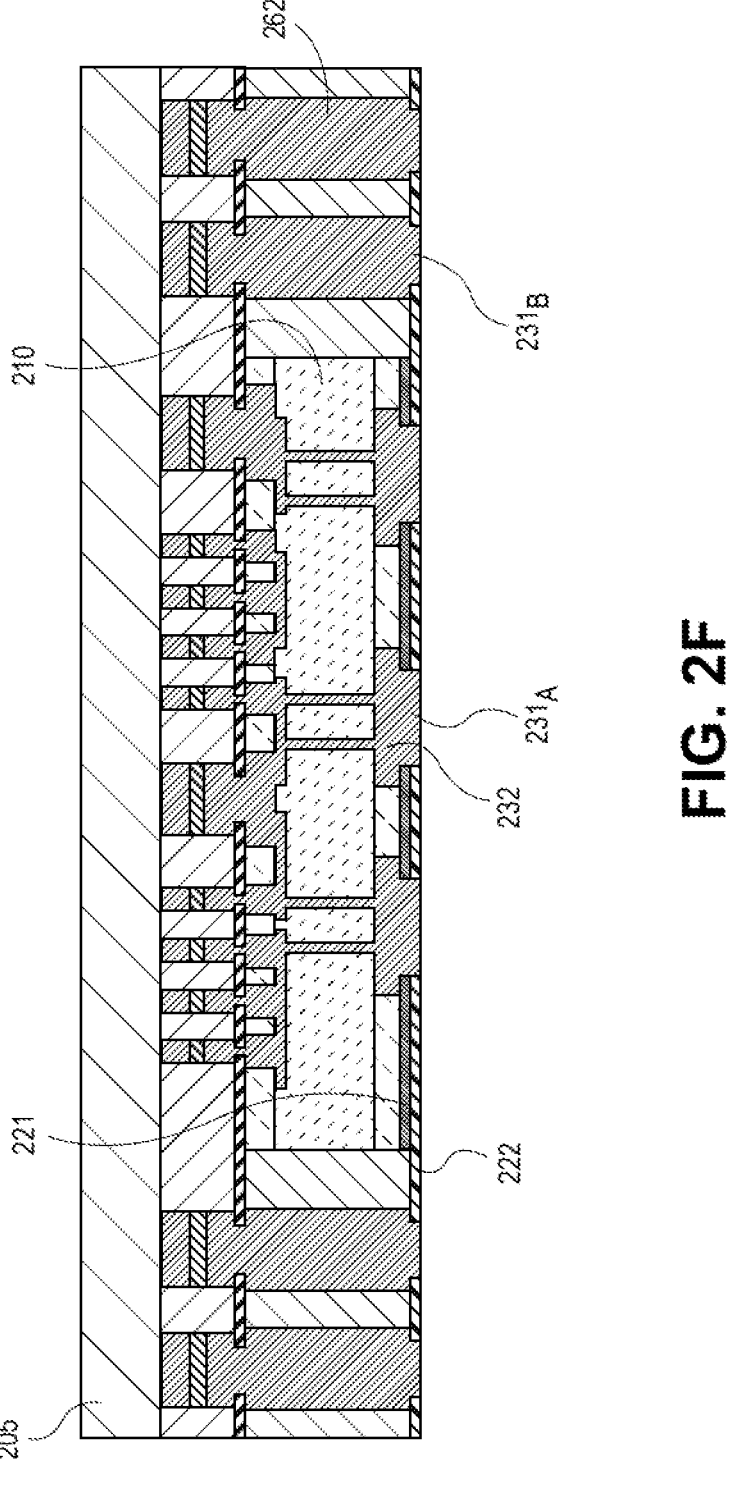
FIG. 2F is a cross-sectional illustration of the module after reset vias are formed through the first dielectric layer and the second dielectric layer, in accordance with an embodiment.

Referring now to FIG. 2F, a cross-sectional illustration of the die module after reset vias 231 are formed is shown, in accordance with an embodiment. In an embodiment, the vias 231 may be formed with a lithography and etching process. First vias 231A may be provided through the first layer 221 and the second layer 222. The first vias 231A may provide contact to the pads 232 under the first die 210. Second vias 231E may be provided through only the second layer 222. The second vias 231E may provide contact to the pillars 262. In an embodiment, the vias 231 may be plated with an electroplating process or the like. Additionally, while shown as having substantially vertical sidewalls, it is to be appreciated that the sidewalls of the vias 231 may be tapered, as described in greater detail above with respect to FIG. 1C. In an embodiment, a narrow end of the first vias 231A may be closer to the first die 210 than a wide end of the first vias 231A. Similarly, the second vias 231E may have a narrow end closer to the pillars 262 than the wide end of the second vias 231B. In an embodiment, the vias 231 may be referred to as reset vias. That is, the vias 231 may be used to correct any offset in the placement of the first die 210 on the glass carrier 260.

Figure 2G:
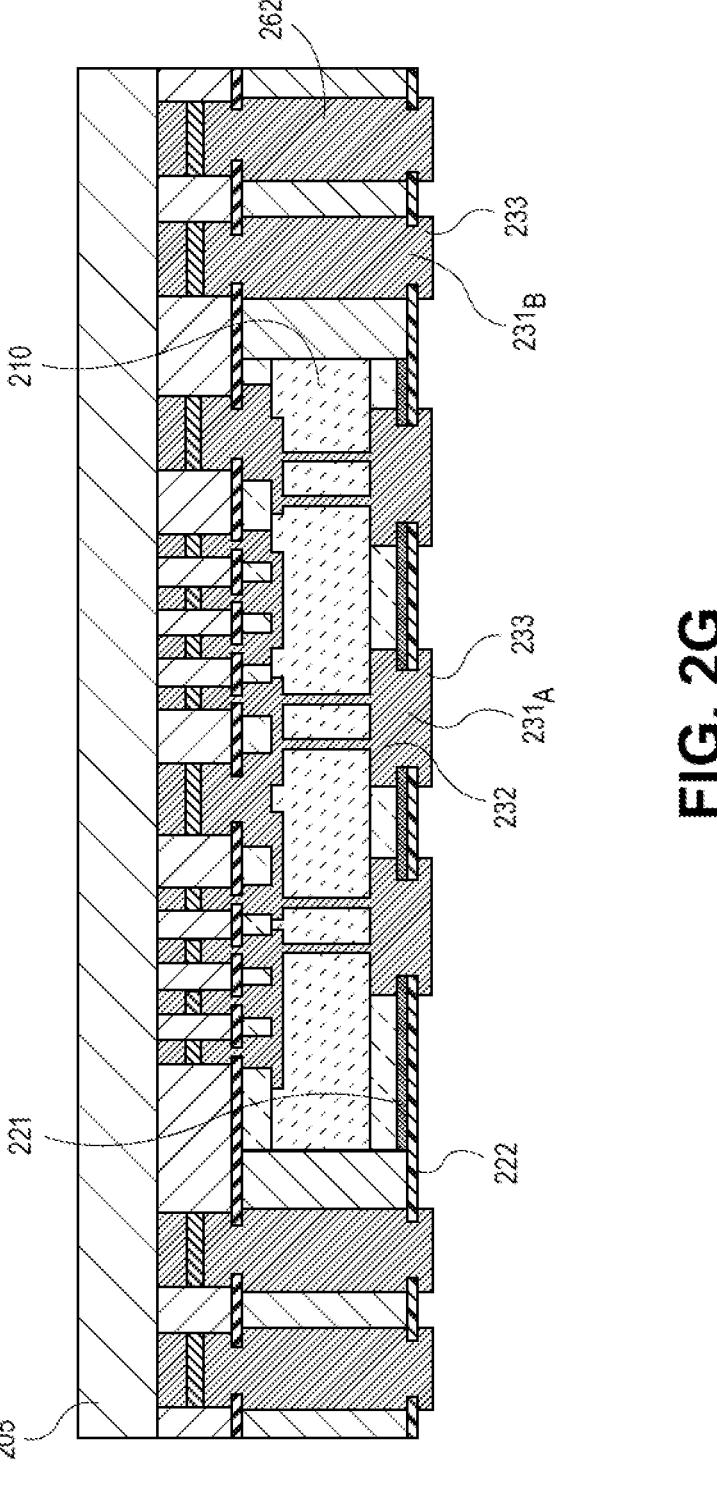
FIG. 2G is a cross-sectional illustration of the module after package side bumps are formed over the reset vias, in accordance with an embodiment.

Referring now to FIG. 2G, a cross-sectional illustration of the die module after package side bumps 233 are formed over the vias 231 is shown, in accordance with an embodiment. In an embodiment, the package side bumps 233 may be formed with a lithographic process and a plating process. In an embodiment, each package side bump 233 is provided over one of the vias 231. The package side bumps 233 over the first vias 231A may be substantially similar to the package side bumps 233 over the second vias 231B. In other embodiments, the package side bumps 233 over the first vias 231A may be different than the package side bumps 233 over the second vias 231B. For example the width of the package side bumps 233 may be variable across the second layer 222. In some embodiments, one or more redistribution layers may be over the second layer 222 before reaching the package side bumps 233.

Figure 2H:
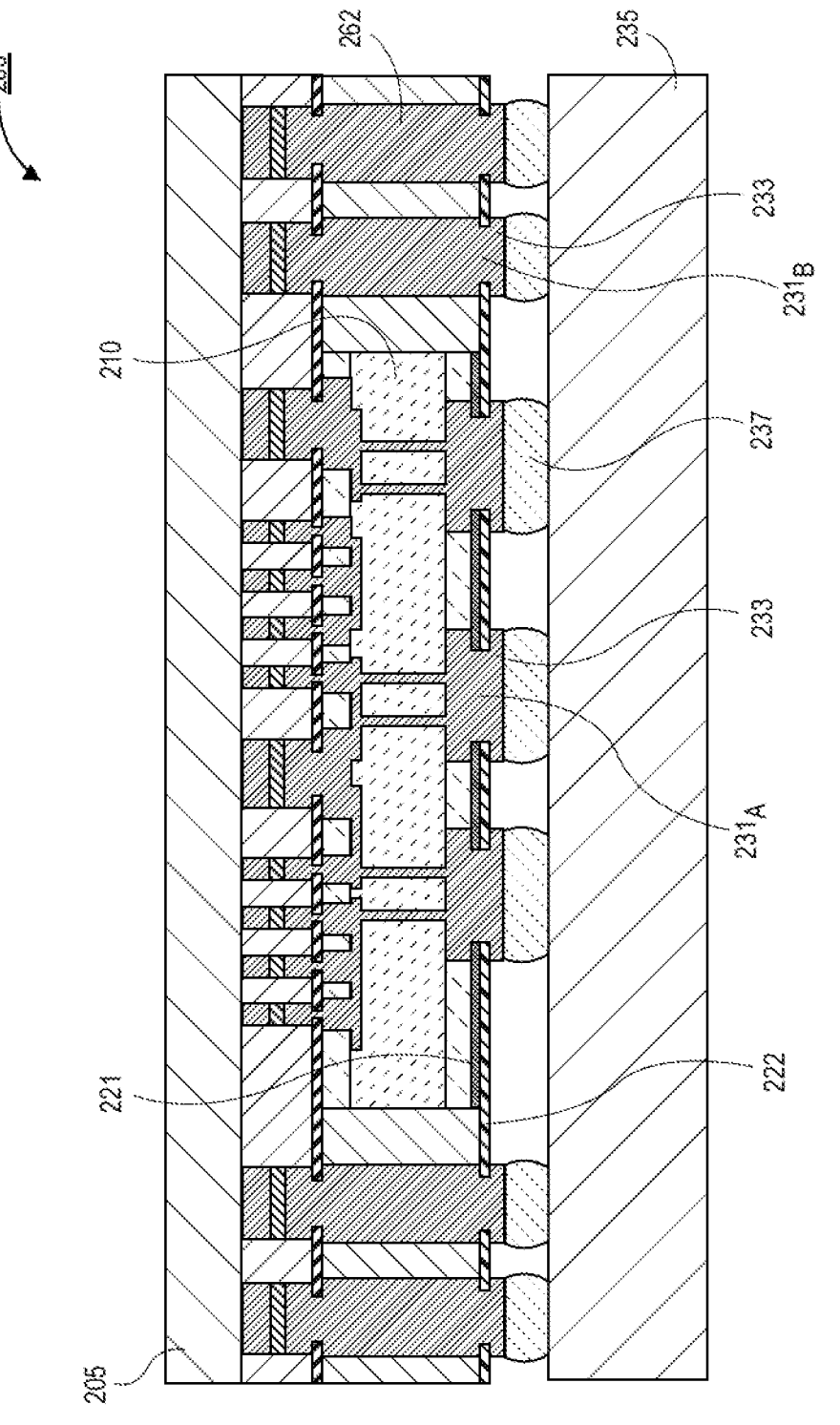
FIG. 2H is a cross-sectional illustration of the module after a package substrate is attached, in accordance with an embodiment.

Referring now to FIG. 2H, a cross-sectional illustration of an electronic package 200 after the attachment of the package substrate 235 is shown, in accordance with an embodiment. In an embodiment, the package substrate 235 may be attached to the die module by interconnects 237. The interconnects 237 may be any suitable first level interconnect (FLI) or mid-level interconnect (MLI) architecture. For example, the interconnects 237 in FIG. 2H are shown as being solder bumps. However, it is to be appreciated that other interconnect architectures may be used in accordance with various embodiments.

In an embodiment, the package substrate 235 may comprise a plurality of laminated dielectric layers. Conductive routing (e.g., traces, vias, pads, etc.) may be embedded in the package substrate 235. The conductive routing in the package substrate 235 is omitted in order to not obscure embodiments disclosed herein. In an embodiment, the package substrate 235 is coreless. In other embodiments, the package substrate 235 may comprise a core.

Electrical signals and/or power/ground lanes may pass from the second die 205 to the package substrate 235. In one embodiment, signals, power, and/or ground may be routed to the package substrate 235 over the pillars 262 that pass adjacent to the first die 210. In other embodiments, signals from the second die 205 may pass to the first die 210. The signals may pass through the first die 210 to the package substrate 235.

Figure 3A:
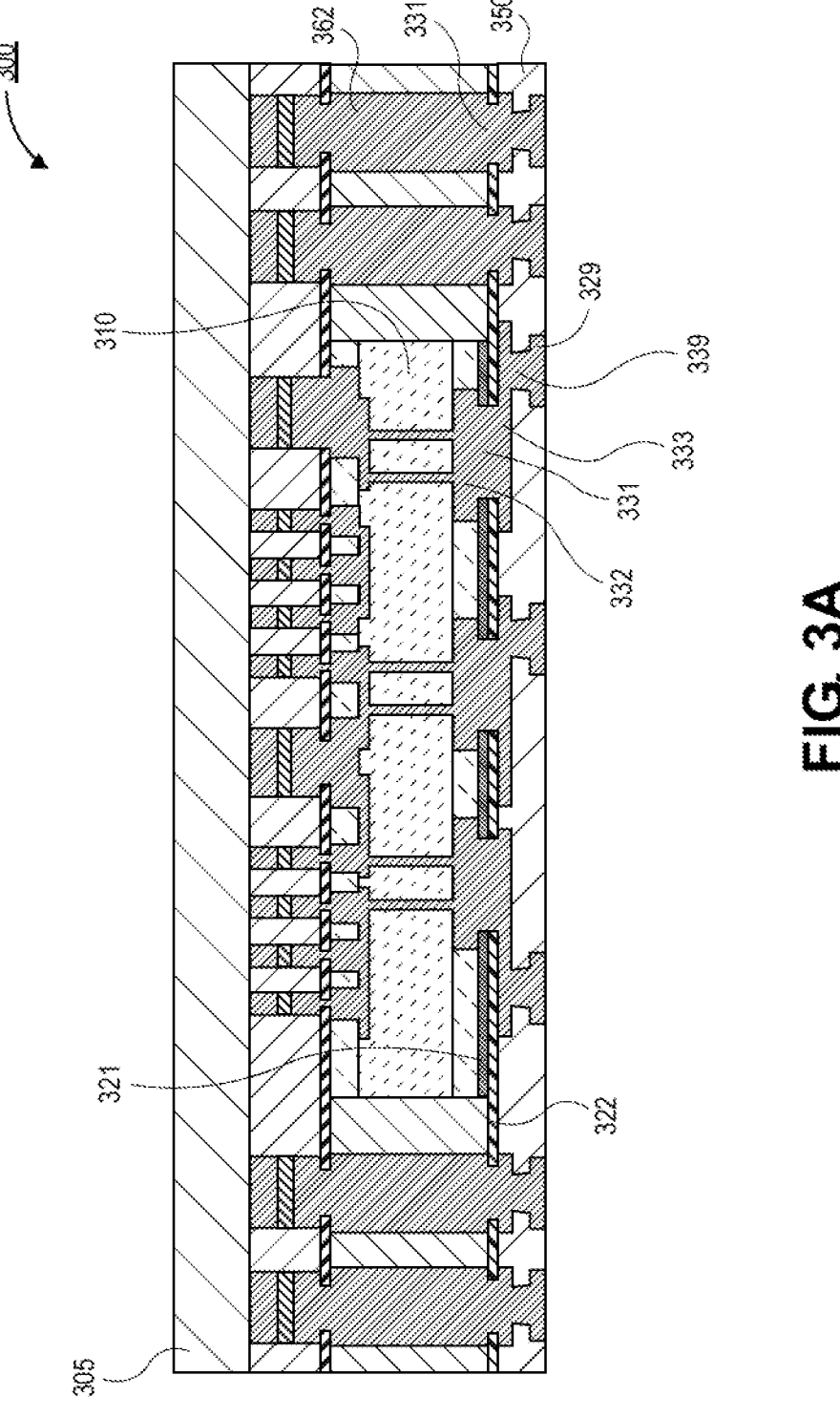
FIG. 3A is a cross-sectional illustration of a multi-die module with a reset via and a redistribution layer, in accordance with an embodiment.
Figure 3B:
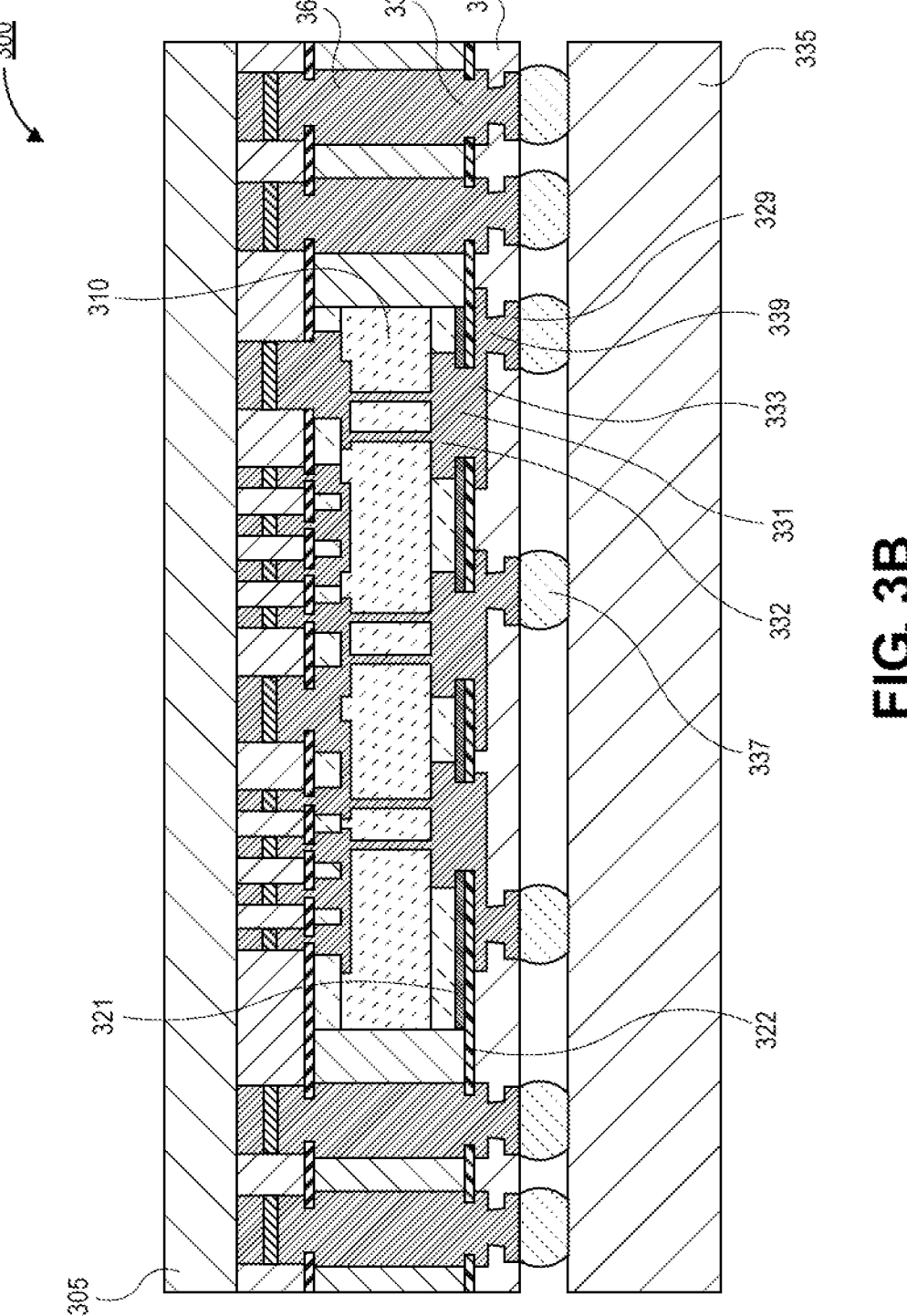
FIG. 3B is a cross-sectional illustration of the multi-die module after a package substrate is attached, in accordance with an embodiment.

Referring now to FIGS. 3A-3B, a pair of cross-sectional illustrations of a process for forming an electronic package is shown, in accordance with an additional embodiment. FIGS. 3A and 3B are similar to the embodiments described above, with the addition of a redistribution layer below the reset vias. That is, the package side bumps may not be formed directly on the reset vias, as is disclosed above.

Referring now to FIG. 3A, a cross-sectional illustration of a die module with a redistribution layer 350 is shown, in accordance with an embodiment. In an embodiment, the die module may be formed using operations substantially similar to those described above with respect to FIGS. 2A-2F, and will not be repeated here for brevity. For example, a first die 310 and an overlying second die 305 are provided. Pillars 362 are provided around the first die 310. Pads 332 on the first die 310 are coupled to reset vias 331 through a first layer 321 and a second layer 322. Reset vias 331 may also be formed through the second layer 322 to contact the pillars 362.

After the processing through FIG. 2F, the process then continues with the fabrication of a redistribution layer 350. The redistribution layer 350 may include traces/pads 333 that are in direct contact with the reset vias 331. Redistribution layer vias 339 may be coupled to the traces/pads 333. In an embodiment, package side bumps 329 may be on a bottom surface of the vias 339. As such, the redistribution layer 350 allows for the redistribution of the placement of the package side bumps 329.

Referring now to FIG. 3B, a cross-sectional illustration of an electronic package 300 after the package substrate 335 is attached to the die module is shown, in accordance with an embodiment. In an embodiment, the package substrate 335 may be attached to the die module by interconnects 337. The interconnects 337 may be any suitable FLI or MLI architecture. For example, the interconnects 337 in FIG. 3B are shown as being solder bumps. However, it is to be appreciated that other interconnect architectures may be used in accordance with various embodiments.

In an embodiment, the package substrate 335 may comprise a plurality of laminated dielectric layers. Conductive routing (e.g., traces, vias, pads, etc.) may be embedded in the package substrate 335. The conductive routing in the package substrate 335 is omitted in order to not obscure embodiments disclosed herein. In an embodiment, the package substrate 335 is coreless. In other embodiments, the package substrate 335 may comprise a core.

Electrical signals and/or power/ground lanes may pass from the second die 305 to the package substrate 335. In one embodiment, signals, power, and/or ground may be routed to the package substrate 335 over the pillars 362 that pass adjacent to the first die 310. In other embodiments, signals from the second die 305 may pass to the first die 310. The signals may pass through the first die 310 to the package substrate 335.

Figure 4:
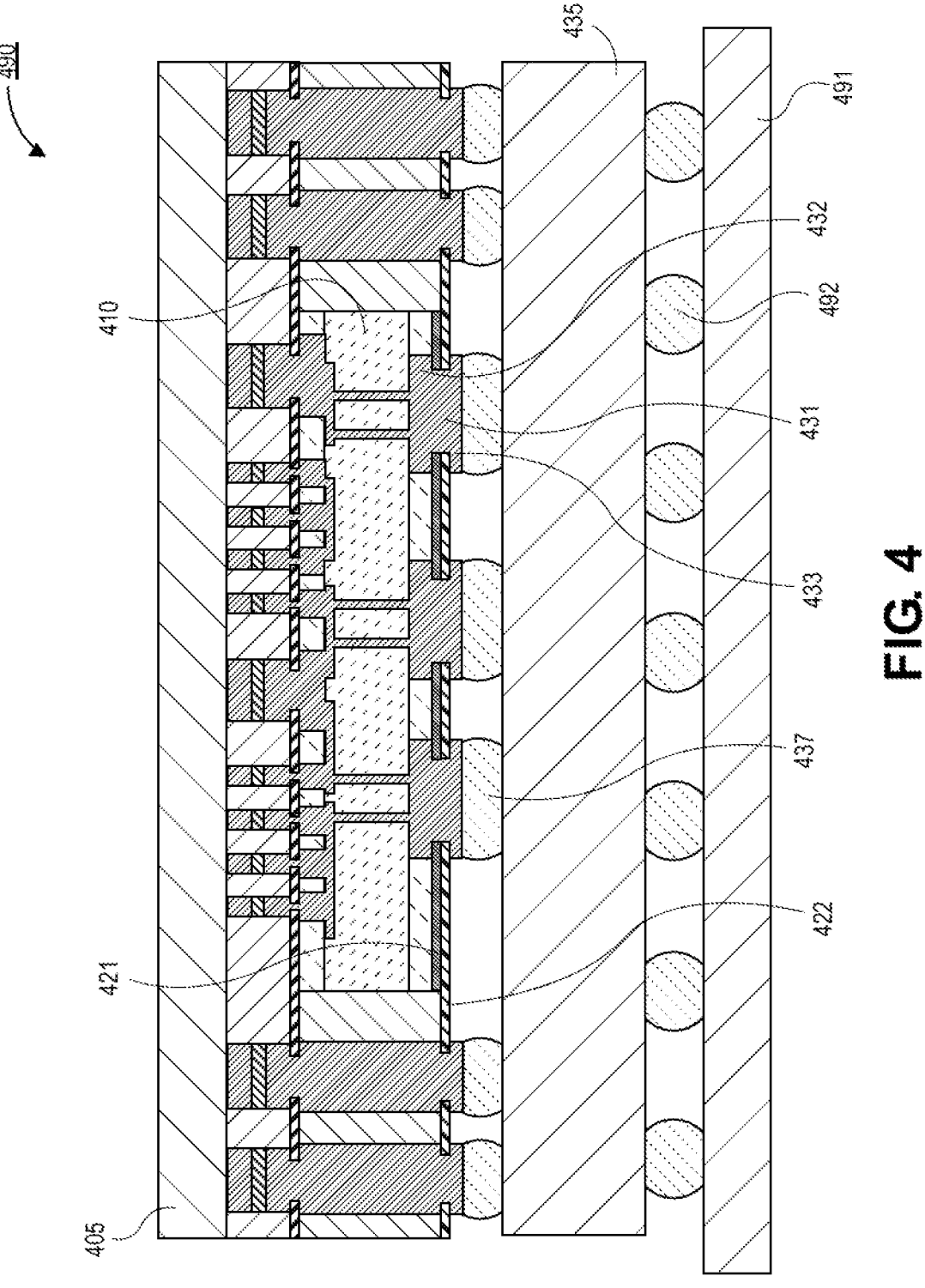
FIG. 4 is a cross-sectional illustration of an electronic system with a multi-die module that includes a reset via, in accordance with an embodiment.

Referring now to FIG. 4, a cross-sectional illustration of an electronic system 490 is shown, in accordance with an embodiment. In an embodiment, the electronic system 490 comprises a board 491, such as a printed circuit board (PCB). In an embodiment, the board 491 is coupled to the package substrate 435 by interconnects 492. For example, the interconnects 492 may be second level interconnects (SLIs). While solder bumps are shown, it is to be appreciated that interconnects 492 may be any suitable architecture. In an embodiment, the package substrate 435 is coupled to a die module by interconnects 437. The interconnects 437 may be any suitable FLI or MLI interconnect architecture.

In an embodiment, the die module comprises a first die 410 and an overlying second die 405. In an embodiment, a first layer 421 and a second layer 422 are provided below the first die 410. The first layer 421 and the second layer 422 may each have a thickness that is approximately 1 μm or smaller. In an embodiment, the first layer 421 and the second layer 422 are dielectric materials that are bonded together. In an embodiment, vias 431 through the first layer 421 and the second layer 422 couple die pads 432 to package side bumps 433. The vias 431 may be tapered in some embodiments.

Figure 5:
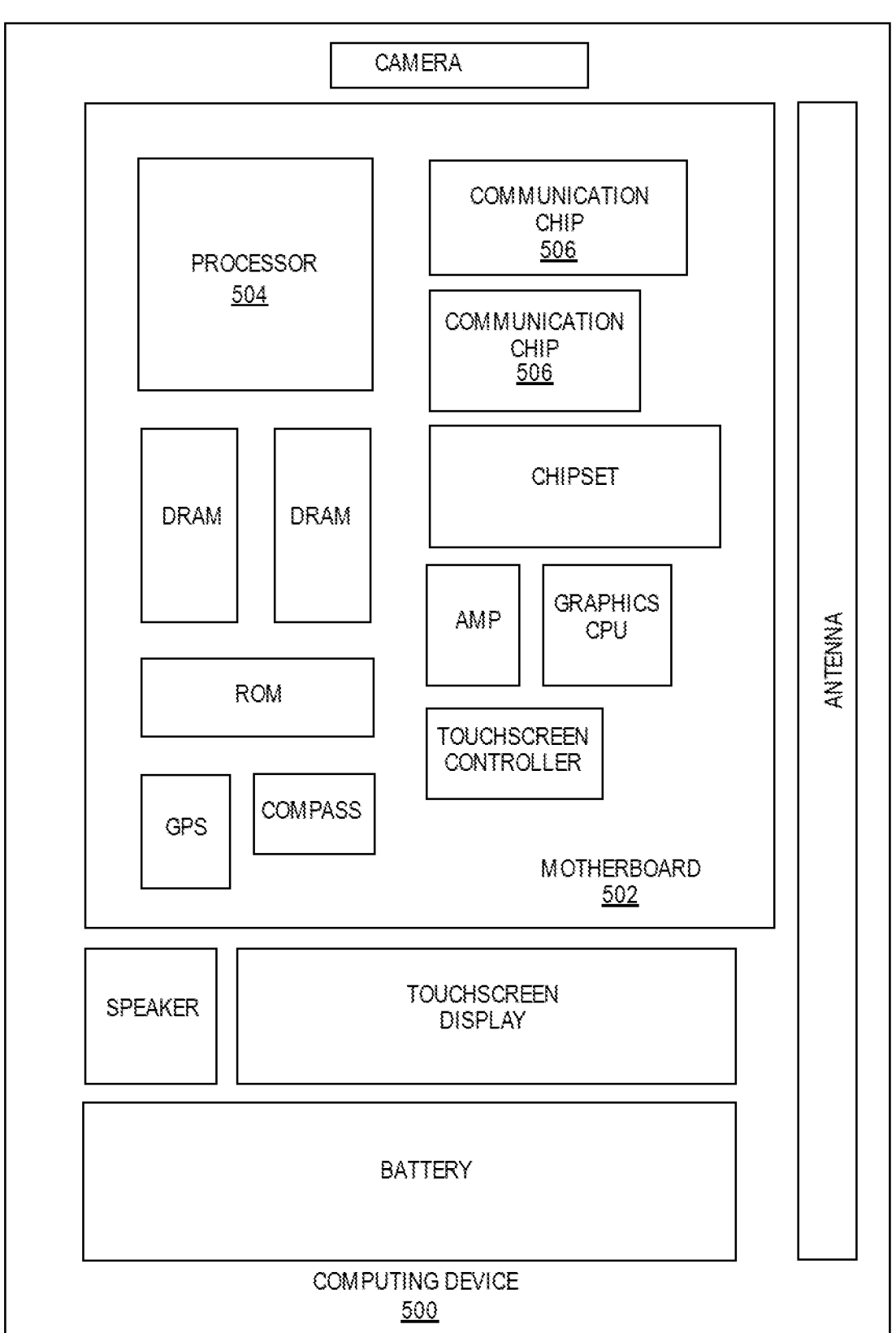
FIG. 5 is a schematic of a computing device built in accordance with an embodiment.

FIG. 5 illustrates a computing device 500 in accordance with one implementation of the invention. The computing device 500 houses a board 502. The board 502 may include a number of components, including but not limited to a processor 504 and at least one communication chip 506. The processor 504 is physically and electrically coupled to the board 502. In some implementations the at least one communication chip 506 is also physically and electrically coupled to the board 502. In further implementations, the communication chip 506 is part of the processor 504.

These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 506 enables wireless communications for the transfer of data to and from the computing device 500. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 506 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 500 may include a plurality of communication chips 506. For instance, a first communication chip 506 may be dedicated to shorter range wireless communications such as Wi-Fi and Bluetooth and a second communication chip 506 may be dedicated to longer range wireless communications such as GPS, EDGE, GPRS, CDMA, WiMAX, LTE, Ev-DO, and others.

The processor 504 of the computing device 500 includes an integrated circuit die packaged within the processor 504. In some implementations of the invention, the integrated circuit die of the processor may be part of an electronic package that comprises a reset via formed through a first dielectric layer and a second dielectric layer to couple a die pad to a package side bump, in accordance with embodiments described herein. The term "processor" may refer to any device or portion of a device that processes electronic data from registers and/or memory to transform that electronic data into other electronic data that may be stored in registers and/or memory.

The communication chip 506 also includes an integrated circuit die packaged within the communication chip 506. In accordance with another implementation of the invention, the integrated circuit die of the communication chip may be part of an electronic package that comprises a reset via formed through a first dielectric layer and a second dielectric layer to couple a die pad to a package side bump, in accordance with embodiments described herein.

The above description of illustrated implementations of the invention, including what is described in the Abstract, is not intended to be exhaustive or to limit the invention to the precise forms disclosed. While specific implementations of, and examples for, the invention are described herein for illustrative purposes, various equivalent modifications are possible within the scope of the invention, as those skilled in the relevant art will recognize.

These modifications may be made to the invention in light of the above detailed description. The terms used in the following claims should not be construed to limit the invention to the specific implementations disclosed in the specification and the claims. Rather, the scope of the invention is to be determined entirely by the following claims, which are to be construed in accordance with established doctrines of claim interpretation.

Example 1: an electronic package, comprising: a die; a through substrate via that passes through the die, wherein the through substrate via is coupled to a backside pad on the die; a first layer over the backside pad, wherein the first layer comprises a first dielectric material; a second layer over the first layer, wherein the second layer comprises a second dielectric material; and a via through the first layer and the second layer.

Example 2: the electronic package of Example 1, wherein the via is tapered.

Example 3: the electronic package of Example 2, wherein a distance between a wide end of the via and the die is greater than a distance between a narrow end of the via and the die.

Example 4: the electronic package of Examples 1-3, wherein the first dielectric material is the same as the second dielectric material.

Example 5: the electronic package of Examples 1-4, wherein the first layer has a thickness that is approximately 1 µm or less.

Example 6: the electronic package of Examples 1-5, wherein the second layer has a thickness that is approximately 1 µm or less.

Example 7: the electronic package of Examples 1-6, wherein the die is coupled to a second die.

Example 8: the electronic package of Example 7, wherein the second die is on an opposite side of the die from the via.

Example 9: the electronic package of Example 7 or Example 8, further comprising: a pillar adjacent to the die; a pad coupled to the pillar, wherein the second layer contacts the pad; and a second via through the second layer, wherein the second via contacts the pad.

Example 10: the electronic package of Examples 7-9, further comprising: a third layer between the die and the second die, wherein a second via passes through the third layer.

Example 11: the electronic package of Examples 1-10, further comprising: a redistribution layer on the via.

Example 12: a via architecture, comprising: a first layer, wherein the first layer comprises a first dielectric material; a second layer over the first layer, wherein the second layer comprises a second dielectric material; and a via through the first layer and the second layer.

Example 13: the via architecture of Example 12, wherein the first layer has a thickness that is approximately 1 µm or less.

Example 14: the via architecture of Example 12 or Example 13, wherein the second layer has a thickness that is approximately 1 µm or less.

Example 15: the via architecture of Examples 12-14, wherein the first dielectric material is the same as the second dielectric material.

Example 16: the via architecture of Examples 12-15, wherein the via is a tapered via.

Example 17: the via architecture of Example 16, wherein the via has a first slope in the first layer and a second slope in the second layer, wherein the first slope is equal to the second slope, or wherein the first slope is different than the second slope.

Example 18: the via architecture of Examples 12-17, further comprising: a first pad over the first layer; and a second pad over the second layer.

Example 19: the via architecture of Examples 12-18, wherein the first dielectric material and/or the second dielectric material comprise silicon and nitrogen, silicon and oxygen, silicon, oxygen, and nitrogen, or silicon, carbon, and nitrogen.

Example 20: an electronic package, comprising: a first die; a mold layer below the first die; a second die embedded in the mold layer and electrically coupled to the first die; a first layer below the second die, wherein the first layer comprises a first dielectric material; a second layer below the first layer and the mold layer, wherein the second layer comprises a second dielectric material; and a via through the first layer and the second layer, wherein the via is electrically coupled to the second die.

Example 21: the electronic package of Example 20, wherein the first layer and the second layer each have a thickness that is approximately 1 μm or less.

Example 22: the electronic package of Example 20 or Example 21, wherein the first dielectric material and the second dielectric material comprise silicon and nitrogen.

Example 23: the electronic package of Examples 20-22, wherein the via is tapered with a narrow end that is a first distance from the second die and a wide end that is a second distance from the second die, wherein the first distance is smaller than the second distance.

Example 24: an electronic system, comprising: a board; a package substrate coupled to the board; and a die module coupled to the package substrate, wherein the die module comprises: a die; a through substrate via that passes through the die, wherein the through substrate via is coupled to a backside pad on the die; a first layer over the backside pad, wherein the first layer comprises a first dielectric material; a second layer over the first layer, wherein the second layer comprises a second dielectric material; and a via through the first layer and the second layer.

Example 25: the electronic system of Example 24, wherein the first layer and the second layer each comprise a thickness that is approximately 1 μm or less.

What is claimed is:

1. An electronic package, comprising:
a die;
a through substrate via that passes through the die, wherein the through substrate via is coupled to a backside pad on the die;
a first layer beneath the backside pad, wherein the first layer comprises a first dielectric material;
a second layer beneath the first layer, wherein the second layer comprises a second dielectric material; and
a via through the first layer and the second layer, the via having a bottommost surface at a same level as a bottommost surface of the second layer.

2. The electronic package of claim 1, wherein the via is tapered.

3. The electronic package of claim 2, wherein a distance between a wide end of the via and the die is greater than a distance between a narrow end of the via and the die.

4. The electronic package of claim 1, wherein the first dielectric material is the same as the second dielectric material.

5. The electronic package of claim 1, wherein the first layer has a thickness that is approximately 1 μm or less.

6. The electronic package of claim 1, wherein the second layer has a thickness that is approximately 1 μm or less.

7. The electronic package of claim 1, wherein the die is coupled to a second die.

8. The electronic package of claim 7, wherein the second die is on an opposite side of the die from the via.

9. The electronic package of claim 7, further comprising:
a pillar adjacent to the die;
a pad coupled to the pillar, wherein the second layer contacts the pad; and
a second via through the second layer, wherein the second via contacts the pad.

10. The electronic package of claim 7, further comprising:
a third layer between the die and the second die, wherein a second via passes through the third layer.

11. The electronic package of claim 1, further comprising:
a redistribution layer on the via.

12. An electronic system, comprising:
a board;
a package substrate coupled to the board; and
a die module coupled to the package substrate, wherein the die module comprises:
a die;
a through substrate via that passes through the die, wherein the through substrate via is coupled to a backside pad on the die;
a first layer beneath the backside pad, wherein the first layer comprises a first dielectric material;
a second layer beneath the first layer, wherein the second layer comprises a second dielectric material; and
a via through the first layer and the second layer, the via having a bottommost surface at a same level as a bottommost surface of the second layer.

13. The electronic system of claim 12, wherein the first layer and the second layer each comprise a thickness that is approximately 1 μm or less.

14. An electronic package, comprising:
a die coupled to a second die;
a through substrate via that passes through the die, wherein the through substrate via is coupled to a backside pad on the die;
a first layer beneath the backside pad, wherein the first layer comprises a first dielectric material;
a second layer beneath the first layer, wherein the second layer comprises a second dielectric material; and
a via through the first layer and the second layer;
a pillar adjacent to the die;
a pad coupled to the pillar, wherein the second layer contacts the pad; and
a second via through the second layer, wherein the second via contacts the pad.

* * * * *